(12) United States Patent
Kim et al.

(10) Patent No.: US 7,268,085 B2
(45) Date of Patent: Sep. 11, 2007

(54) METHOD FOR FABRICATING SEMICONDUCTOR DEVICE

(75) Inventors: Yu-Chang Kim, Kyoungki-do (KR); Soo-Young Park, Kyoungki-do (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 244 days.

(21) Appl. No.: 10/749,909

(22) Filed: Dec. 30, 2003

(65) Prior Publication Data

US 2004/0238482 A1 Dec. 2, 2004

(30) Foreign Application Priority Data

Jun. 2, 2003 (KR) .................. 10-2003-0035281

(51) Int. Cl.
*H01L 21/302* (2006.01)
(52) U.S. Cl. .............. 438/714; 438/717; 438/718; 438/724
(58) Field of Classification Search .......... 438/714, 438/717, 719, 724
See application file for complete search history.

(56) References Cited

U.S. PATENT DOCUMENTS 6,197,630 B1 * 3/2001 Wu et al. ............... 438/238
6,368,982 B1 4/2002 Yu
6,566,264 B1 5/2003 Cave et al.
6,764,893 B2 * 7/2004 Lee et al. ............... 438/233
6,884,676 B2 * 4/2005 Arnold et al. ........... 438/243

FOREIGN PATENT DOCUMENTS

KR  2001-076553  *  8/2001
KR  2002-024735  *  4/2002

* cited by examiner

*Primary Examiner*—George A. Goudreau
(74) *Attorney, Agent, or Firm*—Townsend and Townsend and Crew LLP (57) ABSTRACT

The present invention relates to a method for forming a storage node contact of a semiconductor device. The method includes the steps of: depositing sequentially a conductive layer, a nitride layer and a polysilicon layer on a substrate having an insulating structure and a conductive structure; etching selectively the polysilicon layer, the nitride layer and the conductive layer to form a plurality of conductive patterns with a stack structure of the conductive layer and a dual hard mask including the polysilicon layer and the nitride layer; forming an insulation layer along a profile containing the conductive patterns; and etching the insulation layer by using a line type photoresist pattern as an etch mask to form a contact hole exposing the conductive structure disposed between the neighboring conductive patterns.

18 Claims, 6 Drawing Sheets

METHOD FOR FABRICATING SEMICONDUCTOR DEVICE

FIELD OF THE INVENTION

The present invention relates to a method for fabricating a semiconductor device; and, more particularly to a semiconductor device capable of increasing a contact area during a process for opening a storage node contact and of preventing losses of a bit line hard mask.

DESCRIPTION OF RELATED ARTS

Continuous and diverse attempts have been made to develop a semiconductor device with high-speed and high-performance. Among those various attempts, a technology of securing a contact area is essential to attain large-scale of integration of a semiconductor device.

Generally, a storage node contact can be formed in a line-type or a contact type determined on the basis of a shape of a storage node contact mask. For a simplified process, it is advantageous to form a contact type storage node contact. However, a line type storage node contact is advantageous of securing a contact area in case of a misalignment.

A process for forming the line type storage node contact is more complex than a process for forming the contact type storage node contact, and an etch process cannot be easily applied for the line type storage node contact. Particularly, large portions of a bit line hard mask have been lost during the etching process for forming the line type storage node contact. For this reason, a thickness of the bit line hard mask is increased and thus, an aspect ratio also increases as much as the increased thickness of the bit line hard mask. Therefore, a gap-fill property is degraded during a process for depositing an insulation layer after a bit line is formed.

Due to a trend of downsizing a semiconductor chip, the overall pattern size has been also decreased so that a spacing distance between bit lines is decreased. Also, losses of the bit line hard mask have been augmented during the etching process for forming the line type storage node contact. Hence, the thickness of the bit line hard mask needs to be increased in more extents.

Accordingly, it is required to develop an etching process providing a high etch selectivity with respect to an oxide-based inter-layer insulation layer during the etching process for forming the line type storage node contact. Alternately, it is required to employ an inter-layer insulation layer made of such oxide-based material having a higher etch selectivity than that of a nitride-based material used in the hard mask for the etching process for forming the line type storage node contact. In addition, in a semiconductor device fabrication technology for a line-width below about 80 nm, it is nearly impossible to perform the present conventional storage node contact formation process without advanced new concept of forming the line type storage node contact.

FIGS. 1A to 1F are perspective views illustrating a conventional process for forming a storage node contact.

Figure 1A:
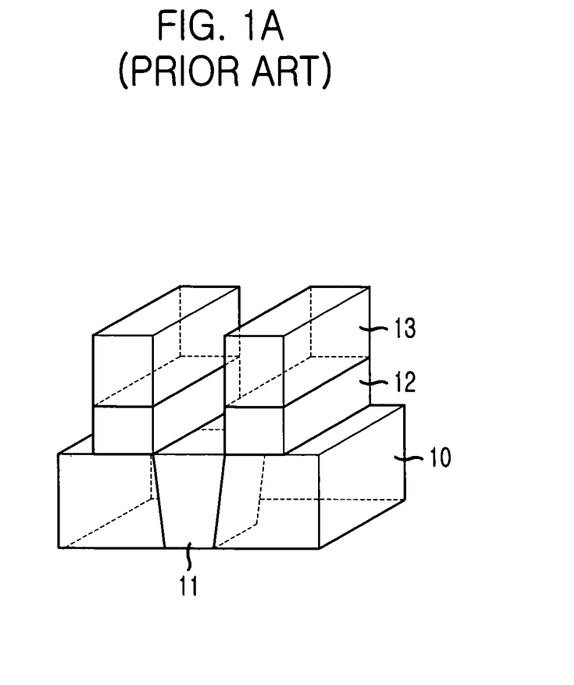
FIGS. 1A to 1F are perspective views illustrating a conventional method for forming a storage node contact.

Referring to FIG. 1A, a plug 11 contacted to a bottom conductive layer, e.g., a source/drain junction, is formed in a substrate 10 providing various elements of a semiconductor device. It should be noted that a plurality of the plugs 11 are formed although only the single plug 11 is shown. Then, a process for forming a plurality of bit lines electrically connected to another bottom conductive layer in the substrate 10 is performed. That is, a conductive layer 12 for a bit line (hereinafter referred to as a bit line conductive layer) and an insulation layer 13 for a hard mask (hereinafter referred to as a hard mask insulation layer) are sequentially deposited on the substrate 10 and are selectively patterned to form a plurality of bit lines.

Particularly, the bit line conductive layer 12 is a single layer or stacked layers of tungsten (W), titanium nitride (TiN), tungsten silicide ($WSi_x$) and polysilicon (Poly-Si). Also, the hard mask insulation layer 13 is typically a nitride layer. A silicon nitride layer or a silicon oxynitride layer is an example of the hard mask insulation layer 13. The hard mask insulation layer 13 has a different etch selectivity from an oxide-based insulation layer during a subsequent storage node contact formation process and has a thickness of below about 3000 Å in order to prevent losses of the bit line conductive layer 12 during an etching process.

Herein, the bit line B/L has a stack structure including the bit line conductive layer 12 and the hard mask insulation layer 13, and the plug 11 is formed in between the bit lines B/L. Although not illustrated, a nitride-based etch stop layer for preventing the plug 11 from being attacked during the etching process for forming the storage node contact is formed.

Figure 1B:
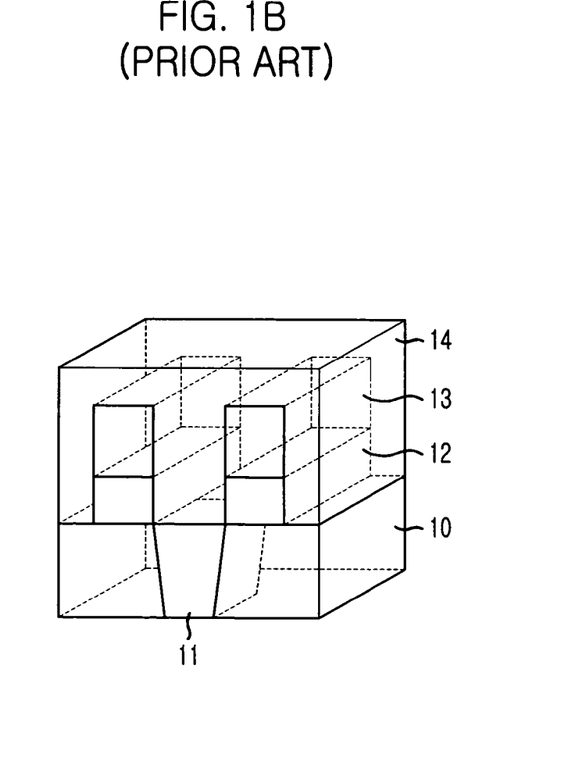

Referring to FIG. 1B, an oxide-based insulation layer 14 (hereinafter referred to as a bit line insulation layer) is deposited on the bit line structure and the exposed substrate 10, and upper part of the resulting structure is planarized. The bit line insulation layer 14 is formed with one of advanced planarization layer (APL) having an excellent gap-fill property and spin-on-glass (SOG). Meanwhile, as described above, the thickness of the hard mask insulation layer 13 increases and conversely the line-width of the hard mask insulation layer 13 decreases. As a result, a spacing distance between the bit lines decreases. These serial effects further cause a gap-fill property to be degraded during the deposition of the bit line insulation layer 14.

Figure 1C:
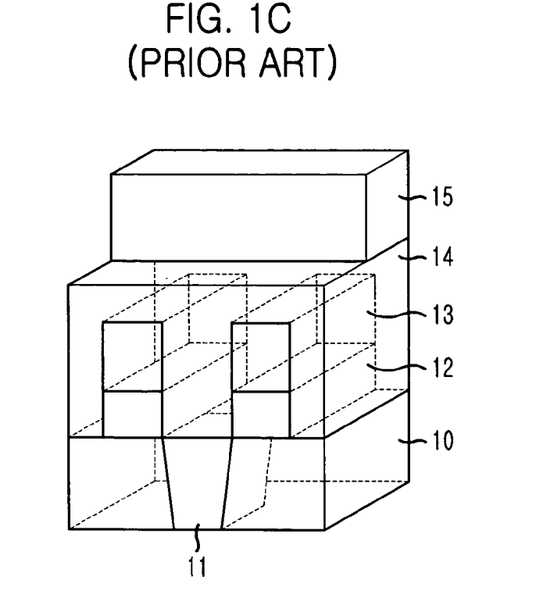

Referring to FIG. 1C, a photoresist is coated on the bit line insulation layer 14 and is subjected to photolithography proceeding a photo-exposure process using a light source of KrF or ArF. Afterwards, a photoresist pattern 15 for forming an opening for a storage node contact is formed. At a bottom part of the photoresist pattern 15, an anti-reflection layer (not shown) can be formed. At this time, the anti-reflection layer is usually made of an organic material. Herein, the photoresist pattern 15 is formed in a line type in a direction of crossing the bit lines.

Figure 1D:
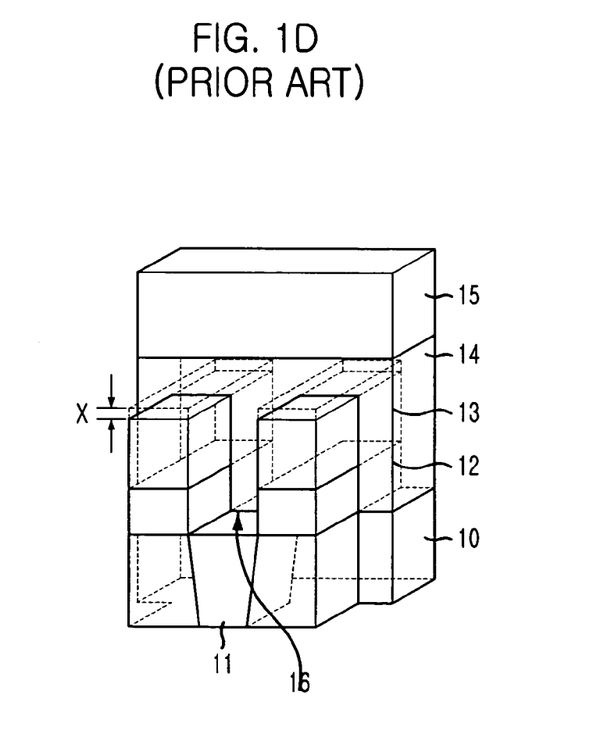

Referring to FIG. 1D, the bit line insulation layer 14 is selectively etched by using the photoresist pattern as an etch mask so that a contact hole 16 exposing a surface of the plug 11 disposed between the bit lines is formed.

In more detail, the anti-reflection layer and a partial portion of the bit line insulation layer 14 are etched to define a contact hole pattern region. Then, the bit line insulation layer 14 is etched with the application of a recipe for a self-align contact (SAC) etching process. From this etching, the contact hole 16 exposing the etch stop layer disposed on the plug 11 is formed, and the remaining photoresist pattern 15 and the antireflection layer are removed. Afterwards, the etch stop layer is removed so as to make the plug 11 exposed.

Meanwhile, an increase in aspect ratio adds burdens on the SAC etching process so that the thickness of the hard mask insulation layer 13 is decreased due to its losses during the SAC etching process. The denotation X in FIG. 1D expresses the loss of the hard mask insulation layer 13.

Figure 1E:
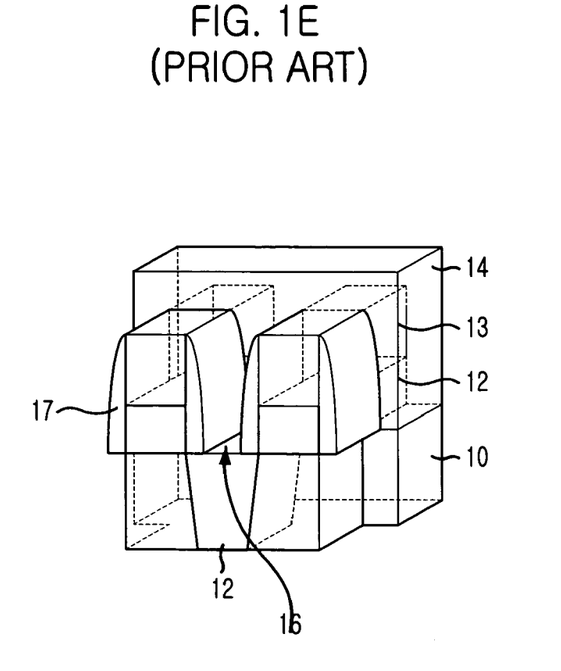

Referring to FIG. 1E, a nitride-based layer such as a silicon oxide layer or a silicon oxynitride layer is deposited on the above resulting structure including the bit lines. Then, a blanket etch-back process is performed thereto to form a spacer 17 at sidewalls of each bit line. The spacer 17 is usually made of a nitride-based material to prevent the bit lines from being attacked and secure an insulation property between a plug for a storage node contact and the bit line. Since the nitride layer has a higher dielectric constant value than that of an oxide layer, there may be a problem of an increased parasitic capacitance of the bit line.

In addition to a method for forming the spacer as explained above, it is also possible to use another method of forming a spacer by depositing first a nitride-based layer for the spacer along a bit line pattern and then leading the nitride-based layer to be an etch stop layer during the contact hole 16 formation process. At this time, the nitride-based layer remains as the spacer at sidewalls of the bit line.

Figure 1F:
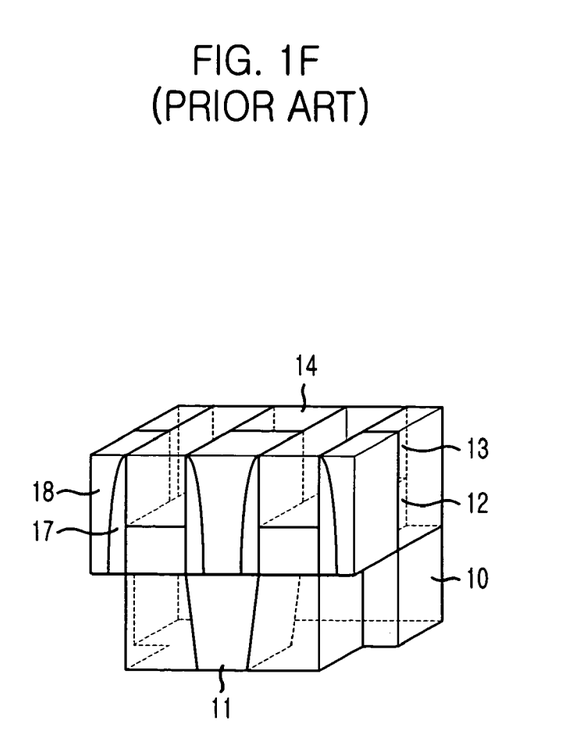

Referring to FIG. 1F, a conductive material is filled into the contact hole 16 and is then planarized until a surface of the hard mask insulation layer 13 is exposed. Afterwards, plugs 18 for storage node contacts contacted to the plug 11 disposed between the bit lines are formed.

The planarization process proceeds by employing a chemical mechanical polishing (CMP) process or an advanced chemical etching (ACE) process. Also, a blanket etch-back process can be locally performed as the planarization process. The conductive material for forming the plugs 18 is a single or combined material of polysilicon or TiN. Therefore, it is necessary to develop a new technology capable of improving a gap-fill property of an insulation layer by decreasing the thickness of any type of hard masks, e.g., the bit line hard mask, disposed on an upper part of a conductive pattern, of preventing the bit line attack during the SAC etching process and of securing a maximal opening area of a contact in a technology for proving a line-width below about 80 nm.

One of such technology is to form a hard mask with a dual structure including a tungsten layer and a nitride layer. In this case, when an etch process for forming conductive patterns proceeds, a conductive layer of the hard mask, i.e., the tungsten layer formed on top of the nitride layer, is removed and the nitride layer of the hard mask is etched away with a certain thickness above about 300 Å.

It is preferable to form the tungsten layer of the hard mask with a thick thickness, so that it is used as an etch barrier layer during a process for forming a line type contact hole. However, the tungsten layer cannot be etched up to a certain thickness if the photoresist pattern is formed in a thin thickness. Also, if the conductive pattern is made of tungsten, the tungsten layer of the hard mask may be entirely removed during the etching process for forming the conductive pattern.

SUMMARY OF THE INVENTION

It is, therefore, an object of the present invention to provide a method for fabricating a semiconductor device capable of improving a gap-fill property of an insulation layer by decreasing a thickness of a hard mask of a conductive pattern.

It is another object of the present invention to provide a method for fabricating a semiconductor device capable of securing a sufficient contact area and simultaneously reducing a parasitic capacitance of a conductive pattern during a process for forming a contact exposing a conductive layer between conductive patterns.

In accordance with an aspect of the present invention, there is provided a method for forming a storage node contact of a semiconductor device, including the steps of: depositing sequentially a conductive layer, a nitride layer and a polysilicon layer on a substrate having an insulating structure and a conductive structure; etching selectively the polysilicon layer, the nitride layer and the conductive layer to form a plurality of conductive patterns with a stack structure of the conductive layer and a dual hard mask including the polysilicon layer and the nitride layer; forming an insulation layer along a profile containing the conductive patterns; etching the insulation layer by using a line type photoresist pattern as an etch mask to form a contact hole exposing the conductive structure disposed between the neighboring conductive patterns.

In accordance with another aspect of the present invention, there is also provided a method for fabricating a semiconductor device, including the steps of: depositing sequentially a bit line conductive layer, a nitride layer and a polysilicon layer on a substrate in which a first plug is formed; etching selectively the polysilicon layer, the nitride layer and the bit line conductive layer to form a plurality of bit lines with a stack structure including the conductive layer and a hard mask with a dual structure of the polysilicon layer and the nitride layer; forming an insulation layer along a profile containing the bit lines; and etching the insulation layer by using a line type photoresist pattern as an etch mask to form a contact hole exposing the first plug disposed between the bit lines.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, there is described a method for fabricating a semiconductor device capable of improving a gap-fill property of an insulation layer, securing a sufficient contact area and simultaneously reducing a parasitic capacitance of a conductive pattern with reference to the accompanying drawings.

FIGS. 2A to 2F are perspective views illustrating a method for forming a storage node contact in accordance with a preferred embodiment of the present invention.

Figure 2A:
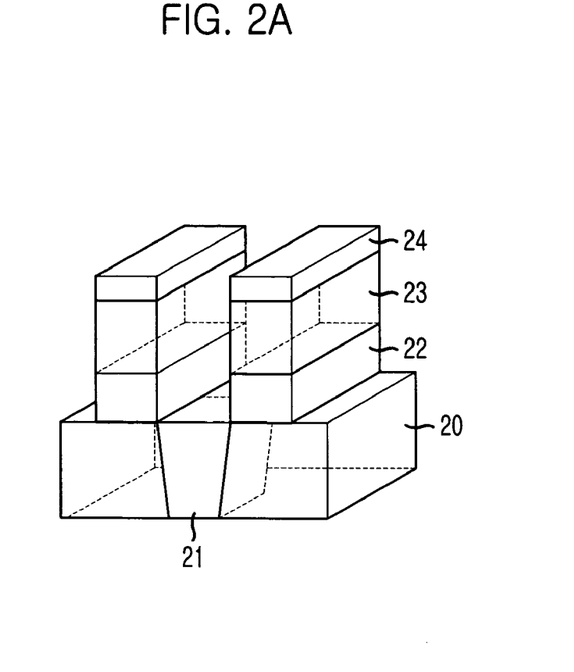
FIGS. 2A to 2F are perspective views illustrating a method for forming a storage node contact in accordance with a preferred embodiment of the present invention.

Referring to FIG. 2A, a plug 21 contacted to a bottom conductive layer, e.g., a source/drain junction, is formed in a substrate 20 providing various elements of a semiconductor device. It should be noted that there formed a plurality of the plugs 21 although only the single plug 21 is illustrated. Then, a process for forming a plurality of bit lines electrically connected to another bottom conductive layer formed in the substrate 20 is performed. That is, a conductive layer 22 for the bit line (hereinafter referred to as a bit line conductive layer), a hard mask nitride layer 23 for a hard mask (hereinafter referred to as a hard mask nitride layer) and a polysilicon layer 24 are sequentially stacked on the substrate 20 and are selectively patterned to form a plurality of bit lines.

The bit line conductive layer 22 is a single layer or stacked layers of tungsten (W), titanium nitride (TiN), tungsten silicide ($WSi_x$), polysilicon (Poly-Si), titanium (Ti) and so on. Also, the hard mask hard mask nitride layer 23 is one of a silicon nitride layer and a silicon oxynitride layer. The hard mask hard mask nitride layer 23 is for providing a different etch selectivity from an oxide-based insulation layer during a subsequent process for forming storage node contacts and prevents losses of the bit line conductive layer 22 during an etching process.

As described above, there is a problem in the conventional method of forming a bit line with a structure of W/TiN/Ti or $WSi_x$/TiN/Ti by using a hard mask formed with a nitride layer or a dual structure of a tungsten layer and a nitride layer. That is, even if the hard mask is formed with the dual structure of the tungsten layer and the nitride layer, only the nitride layer remains as the hard mask after the bit line patterning process. However, in the present invention, the hard mask has a dual structure of the polysilicon layer 24 and the hard mask hard mask nitride layer 23 so that the polysilicon layer 24 and the hard mask hard mask nitride layer 23 still remain on the bit line after the bit line patterning process.

The reason for using the polysilicon instead of the tungsten is because polysilicon can be etched more deeply than tungsten during photolithography using a light source of ArF and a photoresist for ArF. Thus, an ultra fine patterning process providing a line-width below about 80 nm by employing the ArF photolithography can be applicable. Also, the polysilicon layer 24 has a better etch selectivity with respect to an oxide layer than the hard mask nitride layer 23 does. Therefore, it is possible to reduce losses of the hard mask nitride layer 23 during a process for forming a contact hole by a self-aligned contact (SAC) process.

Herein, the hard mask nitride layer 23 is formed with a relatively thin thickness ranging from about 900Å to about 1500Å. Preferably, the polysilicon layer 24 is initially formed with a thickness in a range from about 1000Å to about 2000Å and then remains in a thickness from about 300Å to about 1000Å.

Therefore, the total thickness of the hard mask decreases even with the hard mask with the dual structure, and thus, improving a gap-fill property while a subsequent insulation layer is deposited. During the bit line patterning process, there does not occur losses of the hard mask nitride layer 23. Hence, it is possible to determine the required thickness by being able to take account of any loss of other layers during subsequent processes except for the bit line patterning process. As a result of the above effect, it is further possible to improve process stability and reliability.

As shown in FIG. 2A, each bit line has a stack structure including the bit line conductive layer 22, the hard mask nitride layer 23 and the polysilicon layer 24, and the plug 21 is formed between the bit lines.

Although not illustrated, a nitride-based etch stop layer is formed on an upper surface of the plug 21 to prevent the plug 21 from being attacked during the etching process for forming storage node contacts.

Figure 2B:
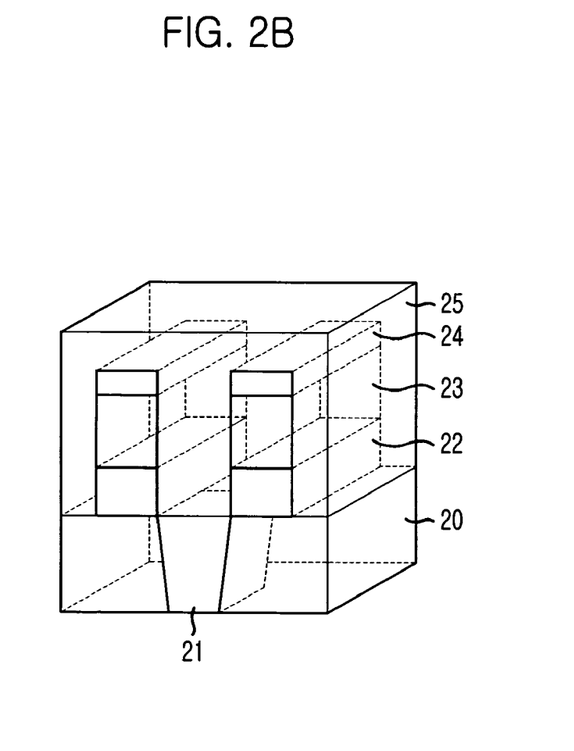

Referring to FIG. 2B, an oxide-based insulation layer 25 is formed an entire surface of the bit line structure and a planarization process is then performed thereto. Herein, this insulation layer 25 is also called as a bit line insulation layer. For the insulation layer 25, one of high density plasma (HDP) oxide, tetra-ethyl-ortho-silicate (TEOS), advanced planarization layer (APL) and spin-on-glass (SOG) is used. Since the height of the bit line pattern is decreased due to decreased overall thickness of the hard mask, an aspect ratio is also decreased. Therefore, such material as HDP oxide and TEOS can be also used even though they have a poor gap-fill property compared to SOG and APL.

Figure 2C:
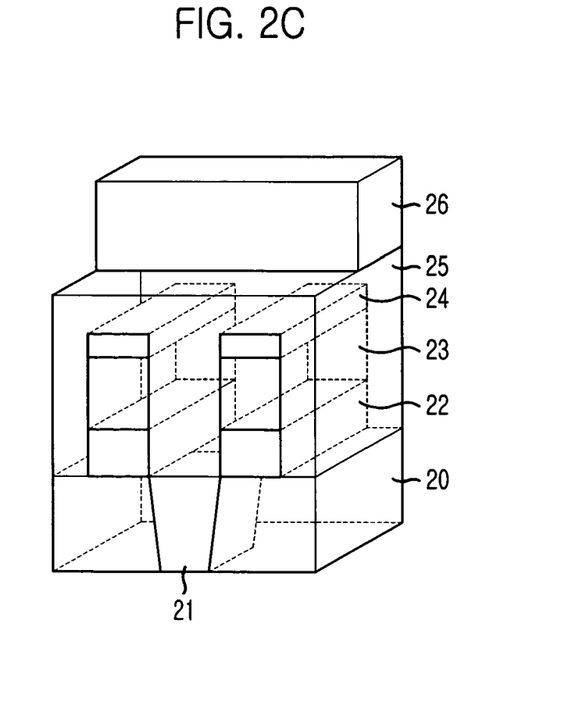

Referring to FIG. 2C, a photoresist is coated on the insulation layer 25, and then, a photoresist pattern 26 for forming an opening for a storage node contact is formed by performing photolithography including a photo-exposure process using a light source of KrF or ArF. Herein, the photoresist pattern 26 is formed in a line type in a direction of crossing the bit lines. In addition, an anti-reflection layer (not shown) can be formed beneath the photoresist pattern 26. At this time, the anti-reflection layer uses an organic material.

Figure 2D:
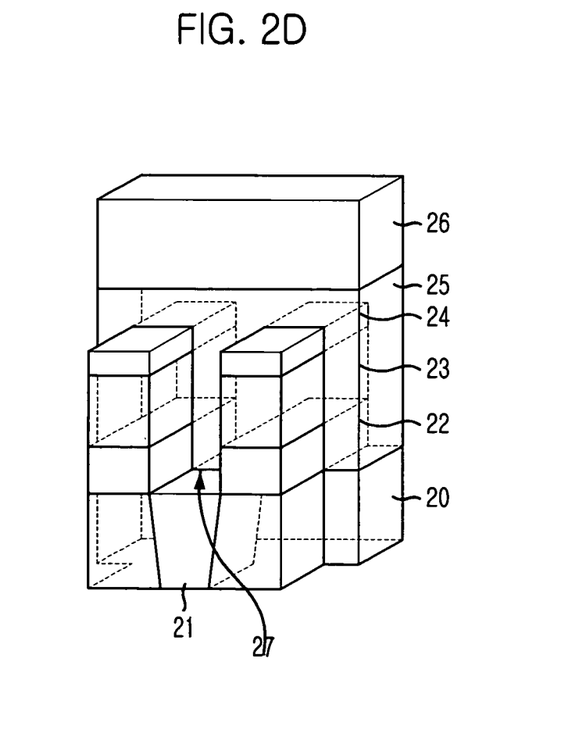

Referring to FIG. 2D, the insulation layer 25 is selectively etched by using the photoresist pattern 26 as an etch mask to form a contact hole 27 exposing a surface of the plug 21 formed between the bit lines.

In more detail of the contact hole 27 formation, the anti-reflection layer and a partial portion of the insulation layer 25 are etched by using the photoresist pattern 26 as an etch mask so as to define a contact hole pattern region. Subsequently, a recipe for the SAC etching process is employed to etch the insulation layer 25 so that the contact hole 27 exposing the etch stop layer disposed on the plug 21 is formed. Thereafter, the remaining photoresist pattern 26 and the anti-reflection layer are removed.

Next, the etch stop layer is removed by performing an etching process without using a mask so as to expose the plug 21. Thus, only a partial portion of the polysilicon layer 24 is etched away. Since the polysilicon layer 24 has a higher etch selectivity with respect to an oxide layer than that of the hard mask nitride layer 23 during the formation of the line type contact hole 27, the loss of the hard mask polysilicon layer 24 is not high.

Herein, for the formation of the contact hole 27, the etching process is performed in three steps. However, it is also possible to perform the etching process consecutively in one step or perform in multi-steps, e.g., in two steps or more than four steps.

Figure 2E:
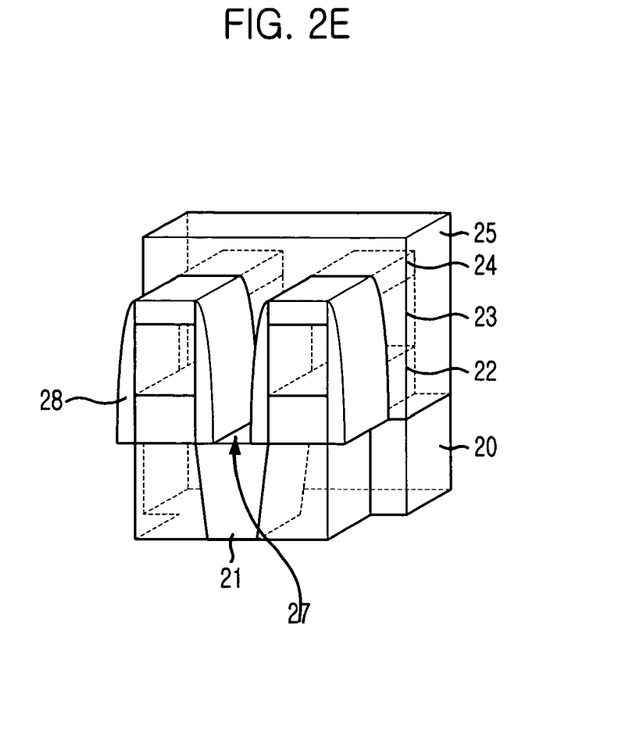

Referring to FIG. 2E, an oxide-based material is deposited on the above resulting structure including the bit lines and is subjected to a blanket etch-back process so as to form a spacer 28 at sidewalls of each bit line. The spacer 28 is for preventing the bit lines from being attacked during a subsequent process and securing an insulation property between a plug for a storage node contact and the bit line. Unlike the conventional method of forming a spacer at sidewalls of a bit line through the SAC etching process performed after the oxide-based layer is deposited along the bit line profile, a material for forming the spacer 28 according to the present invention can be deposited after the contact hole 27 is formed. Thus, it is possible to use an oxide-based material having a lower dielectric constant value than that of a nitride-based layer. As a result of this usage of the oxide-based material for the spacer 28, a parasitic capacitance of the bit line can be reduced.

Figure 2F:
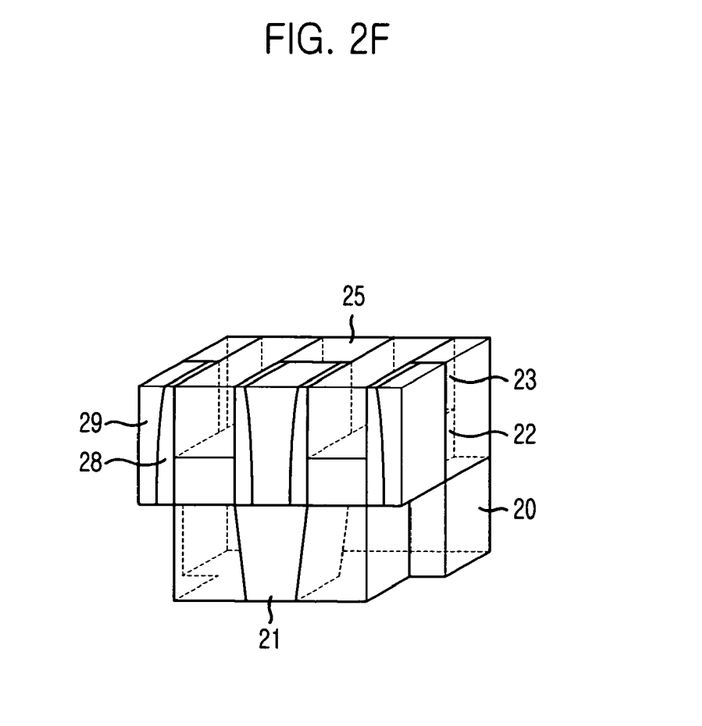

Referring to FIG. 2F, a conductive material is filled into the contact hole 27 and is then planarized until a surface of the hard mask nitride layer 23 is exposed so that plugs 29 for storage node contacts (hereinafter referred to as storage node contact plugs) are formed. Herein, the storage node contact plug 29 is contacted to the plug 21 disposed between the bit lines. At this time, the polysilicon layer 24 is preferably eliminated. The planarization process can proceed by employing a CMP process or an advanced chemical etching (ACE) process. Also, a blanket etch-back process can be locally applied as the planarization process.

Herein, the conductive material for forming the storage node contact plugs 29 can be a single or a combined material of polysilicon and titanium nitride (TiN). It is advantageous of using polysilicon as the storage node contact plug 29 since this employed polysilicon is the same material as of the polysilicon layer 24. Therefore, the loss of the hard mask nitride layer 23 occurs only during the planarization process for isolating the storage node contact plugs 29, and thereby improving process reliability in respect of attainment of the intended thickness of the hard mask for the bit lines.

In a patterning process having a line-width below about 100 nm by using ArF photolithography, the present invention enables the hard mask with the dual structure to remain on the bit line structure by employing the polysilicon layer instead of the tungsten layer. Also, the polysilicon layer remaining on the bit line structure further provides an effect on an improvement on process reliability by preventing the loss of the hard mask nitride layer during the etching process for forming the line type storage node contacts. Also, without employing the dual hard mask structure described in the present invention, the thickness of the hard mask nitride layer should be increased for the line type storage node contact formation process, and thus, a gap-fill property of the bit line insulation layer is degraded. This degradation further requires an additional cost for applying a new material to overcome this gap-fill property problem. However, the dual hard mask structure constructed according to the present invention solves this cost problem since the thickness of the hard mask nitride layer needs not to be increased. As a result of the above described effects from the present invention, yields of semiconductor devices are ultimately enhanced.

In addition, although the preferred embodiment of the present invention exemplifies the case of forming the bit line, it is still possible to apply the present invention to other various types of conductive patterns having a hard mask, e.g., a gate electrode or a metal wire. Therefore, it is also possible to apply the present invention to processes for forming other types of contact holes in addition to the exemplary line type storage node contact formation process.

While the present invention has been described with respect to certain preferred embodiments, it will be apparent to those skilled in the art that various changes and modifications may be made without departing from the scope of the invention as defined in the following claims.

What is claimed is:

1. A method for forming a storage node contact of a semiconductor device, the method comprising:
   depositing sequentially a conductive layer, a nitride layer and a polysilicon layer over a substrate, where at least one contact plug contacts the substrate;
   patterning the polysilicon layer, the nitride layer and the conductive layer to form at least first and second conductive patterns, the patterned conductive layer defining the first and second conductive patterns, the patterned polysilicon and nitride layers defining first and second dual hard mask patterns provided over the first and second patterned conductive patterns, respectively, wherein the first and second conductive patterns define a first hole therebetween, the first hole being provided directly over the contact plug;
   forming an insulation layer over the first and second dual-hard masks and into the first hole; and
   selectively etching the insulation layer to define a second hole and expose the contact plug.

2. The method as recited in claim 1, the method further including:
   after forming the second hole, depositing an oxide layer at least along a profile of the second hole; and
   thereafter, forming a spacer at sidewalls of each conductive pattern by etching the oxide layer through a blanket etch-back process.

3. The method as recited in claim 1, wherein the polysilicon layer is first deposited to a thickness ranging from about 1000Å to about 2000Å and is set to remain in a thickness ranging from about 300 to about 1000Å after the bitline patterns are formed.

4. The method as recited in claim 1, wherein the nitride layer has a thickness ranging from about 900Å to about 1500Å.

5. The method as recited in claim 1, wherein the first and second conductive patterns are bit lines, gate electrodes, or metal wire.

6. The method as recited in claim 1, wherein the conductive layer is made of a material selected from the group consisting of tungsten (W), titanium nitride (TiN), tungsten silicide ($WSi_x$), polysilicon (Poly-Si) and titanium (Ti).

7. The method as recited in claim 1, wherein the plug is formed with one of polysilicon and titanium nitride.

8. The method as recited in claim 1, the insulation layer is made of a material selected from the group consisting of high density plasma (HDP) oxide, tetra-ethyl-ortho-silicate (TEOS), advanced planarization layer (APL) and spin-on-glass (SOG).

9. The method as recited in claim 1, wherein the insulation layer is etched using a line type photoresist pattern as an etch mask to define the second hole exposing the contact plug, wherein the photoresist pattern is removed after forming the second hole.

10. The method as recited in claim 9, wherein the photoresist pattern is formed using a light source of ArF or KrF.

11. The method as recited in claim 1, further comprising:
    providing conductive material over the polysilicon layer, the conductive material filling the second hole; and
    removing the at least conductive material and the polysilicon layer to form a planarized conductive structure that electrically couples to the contact plug, the conductive structure having an upper surface that is substantially planar to an upper surface of the nitride layer.

12. A method for fabricating a semiconductor device, the method comprising:

depositing sequentially a bit line conductive layer, a nitride layer and a polysilicon layer over a substrate in which a first plug is formed;

etching the polysilicon layer, the nitride layer and the bit line conductive layer to form at least first and second bit lines, the etched polysilicon and nitride layers defining first and second dual-structure mask patterns provided over the first and second bit lines, respectively;

forming an insulation layer over the first and second dual-structure mask patterns and into a first hole defined between the first and second bit lines, the first hole being defined directly over the first plug; and etching the insulation layer to form a second hole exposing the first plug.

13. The method as recited in claim 12, the method further including:

after forming the second hole, depositing an oxide layer at least along a profile of the second hole; and thereafter, forming a sidewall spacer for each bit line by etching the oxide layer through a blanket etch-back process.

14. The method as recited in claim 12, wherein the polysilicon layer is first deposited to a thickness ranging from about 1000Å to about 2000Å and is set to remain in a thickness ranging from about 300Å to about 1000Å after the bit lines are formed.

15. The method as recited in claim 12, wherein the nitride layer has a thickness ranging from about 900Å to about 1500Å.

16. The method as recited in claim 12, wherein the conductive layer is made of a material selected from the group consisting of tungsten (W), titanium nitride (TiN), tungsten silicide ($WSi_x$), polysilicon (Poly-Si) and titanium (Ti).

17. The method as recited in claim 12, the insulation layer is made of a material selected from the group consisting of high density plasma (HDP) oxide, tetra-ethyl-ortho-silicate (TEOS), advanced planarization layer (APL) and spin-on-glass (SOG).

18. The method as recited in claim 12, further comprising:

depositing a plug material into the second hole and over the exposed first plug; and removing at least the plug material and the polysilicon layer to form at least one second plug that electrically couples the first plug, wherein the plug material and the polysilicon layer are removed until an upper surface of the nitride layer and is substantially planar to an upper surface of the second plug.

* * * * *